United States Patent

Miyazima et al.

Patent Number: 6,078,531
Date of Patent: Jun. 20, 2000

[54] WORD LINE VOLTAGE SUPPLY CIRCUIT

[75] Inventors: Yoshifumi Miyazima, Nagasaki, Japan; Patrick Chuang, San Jose, Calif.; Hisanobu Tsukazaki, Nagasaki, Japan

[73] Assignee: Sony Corporation, Tokyo, Japan

[21] Appl. No.: 09/232,696

[22] Filed: Jan. 19, 1999

[30] Foreign Application Priority Data

Jan. 20, 1998 [JP] Japan .................................. 10-009032

[51] Int. Cl.[7] .................................................. G11C 7/00
[52] U.S. Cl. ............................... 365/189.11; 365/189.07; 365/226; 365/233.5
[58] Field of Search .......................... 365/189.11, 189.07, 365/230.06, 226, 233.5

[56] References Cited

U.S. PATENT DOCUMENTS

| | | | |
|---|---|---|---|
| 4,751,683 | 6/1988 | Wada et al. | 365/233.5 |
| 4,891,793 | 1/1990 | Anami | 365/204 |
| 5,394,077 | 2/1995 | Atsumi | 323/223 |
| 5,592,063 | 1/1997 | Savignac et al. | 320/166 |
| 5,612,924 | 3/1997 | Miyamoto | 365/233.5 |
| 5,966,342 | 10/1999 | Na | 365/230.06 |

*Primary Examiner*—David Nelms
*Assistant Examiner*—Gene N. Auduong
*Attorney, Agent, or Firm*—Ronald P. Kananen; Rader, Fishman & Grauer

[57] ABSTRACT

An address transition detector (ATD) detects a change of address and generates a pulse signal Sc. A control circuit generates a pulse signal Sd and outputs it to a booster circuit in response to a timing of completion of the signal Sc. The booster circuit generates a boosted voltage higher in level than a power supply voltage during an active period of the signal Sd and outputs it to a decoder. The decoder holds the control gate of the output transistor connected to the word line selected in response to the address at a first voltage level, then inputs the boosted voltage to one of the source and drain electrodes so as to hold the gate at a second voltage level higher than the first voltage level by exactly the boosted voltage using capacitive coupling between the control gate and the one of the source and drain electrodes, whereby it outputs a boosted voltage to the other of the drain and source electrodes and drives the word line connected to the other of the drain and source electrodes. Since a boosted voltage higher than the power supply voltage is supplied to the selected word line, the write operation can be carried out reliably and deterioration of the data holding characteristic of the memory cell due to the reduction of the power supply voltage can be prevented.

7 Claims, 12 Drawing Sheets

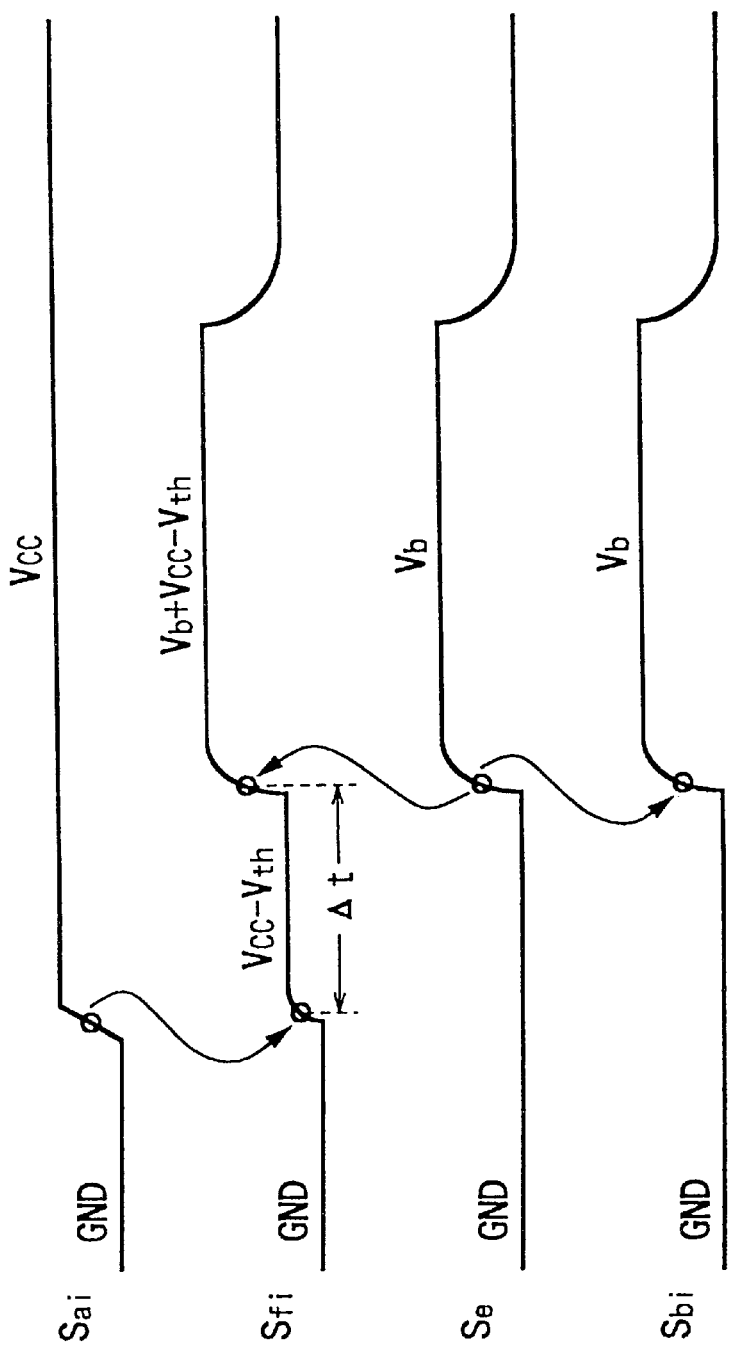

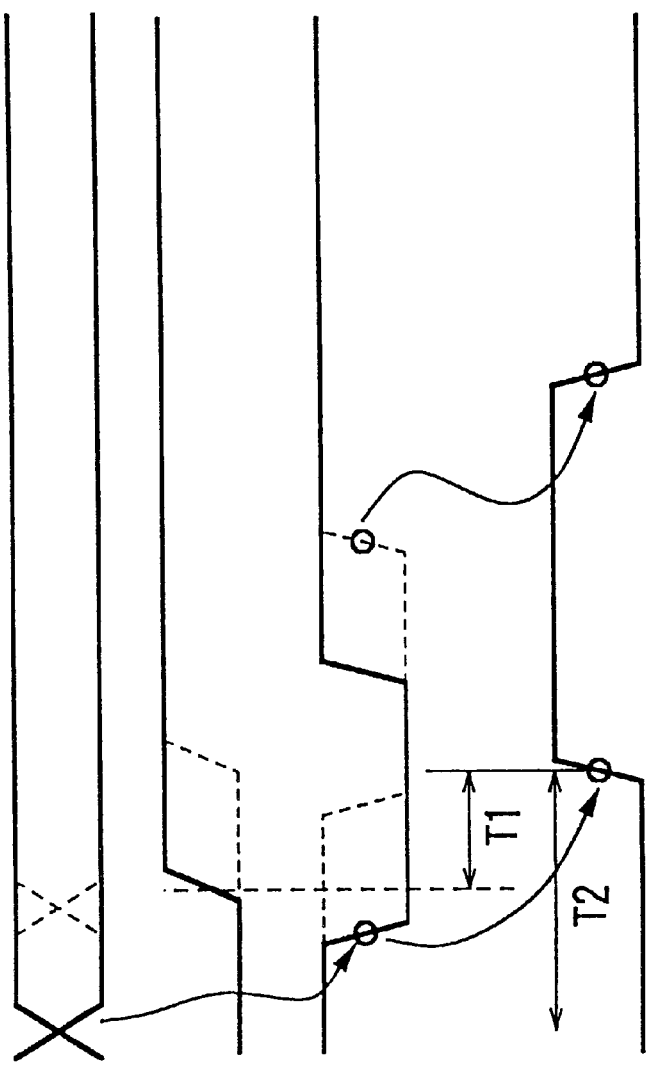

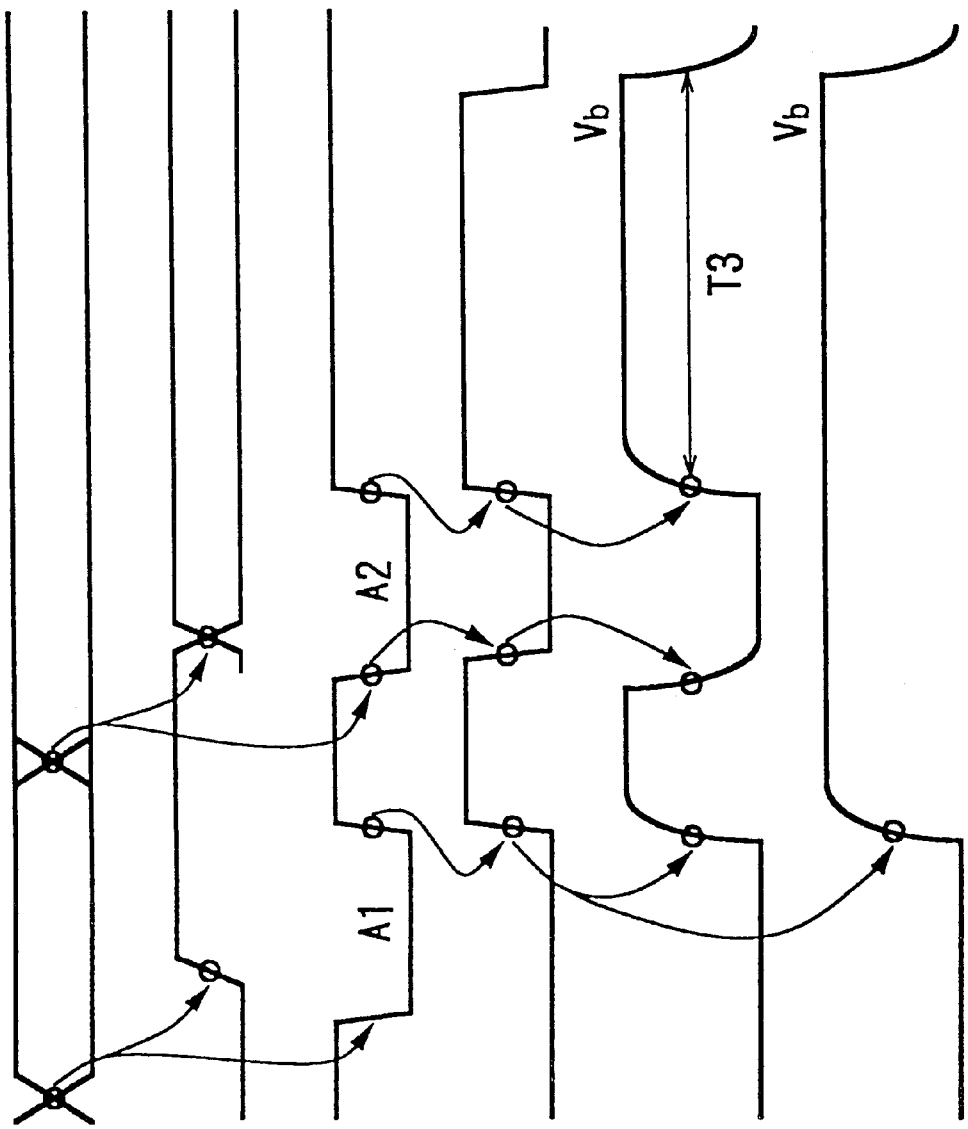

WORD LINE VOLTAGE SUPPLY CIRCUIT

BACKGROUND OF THE INVENTION

1. Field of the Invention

The present invention relates to a word line voltage supply circuit for supplying a predetermined driving voltage to word lines of, for example, an asynchronous static random access memory (SRAM).

2. Description of the Related Art

In recent years, along with the reduction of power supply voltages, asynchronous SRAMs have been developed for improving the stability of operations by using booster circuit technology. In a memory cell of an SRAM, the holding characteristic of storage data tends to become unstable when operating at a low power supply voltage. To avoid this, measures such as using a booster circuit to generate a voltage higher than the power supply voltage and supply it to selected word lines are generally devised.

FIG. 12 is a circuit diagram of an example of the configuration of an SRAM memory cell. Note that, here, a memory cell of a high resistance load type SRAM is shown as an example.

As illustrated, the memory cell MC of a high resistance load type SRAM is constituted by n-channel MOS transistors (hereinafter simply referred to as nMOS transistors) TR1, TR2, TR3, and TR4 and resistors R1 and R2. The resistors R1 and R2 are high value resistors formed by, for example, polycrystalline silicon and constitute load elements of the transistors TR1 and TR2, respectively. In the memory cell MC, nodes N1 and N2 constitute storage nodes. The storage nodes N1 and N2 are connected to a bit line BL and a bit line/BL (hereinafter referred to as bit sub line/BL) through the transistors TR3 and TR4. The transistors TR3 and TR4 are connected to the word line WL at their gates and are controlled in on/off states according to the voltage supplied to the word line WL. Note that the transistors TR3 and TR4 are also called access transistors. The storage nodes N1 and N2 are set at levels according to the write data due to a write operation.

For example, the bit line BL is set at a high level, for example, the level of a power supply voltage Vcc while the bit sub line/BL is set at a low level, for example, the level of the ground GND, according to the write data. After the levels of the bit line and the bit sub line become finally determined, since the word line WL is set at a high level by a decoder, the access transistors TR3 and TR4 are held in the on state. Therefore, the levels of the bit line BL and the bit sub line/BL are output to the storage nodes N1 and N2. In the situation mentioned above, the storage node N1 is set at the high level while the storage node N2 is set at the low level, respectively. When the levels of the storage nodes N1 and N2 are finally determined, the word line WL is switched to the low level and the transistors TR3 and TR4 are held at the off states. The levels of the storage nodes N1 and N2 are held by the memory cell MC.

Here, by defining the state of the storage node N1 being the high level and the storage node N2 being the low level as the data "1" while defining the state of the storage node N1 being the low level and the storage node N2 being the high level as the data "0", 1 bit of information can be stored by the memory cell MC. Furthermore, since the levels of the storage nodes are held, information in accordance with the levels of the storage nodes is stored by the memory cell MC until the next rewrite operation.

In the memory cell MC of the SRAM mentioned above, there is a disadvantage that along with the reduction in the power supply voltage, the data write operation becomes uncertain or the data holding characteristic becomes unstable.

Due to the reduction of the power supply voltage, the level of the voltage of the signal supplied to the selected word line becomes lower during a write operation. Along with this, the voltage of the signal input to the storage nodes of the memory cell becomes lower. For example, in a write operation, when the bit line BL is held at the level of the power supply voltage Vcc according to the write data and a write pulse having the level of the power supply voltage is input to the selected word line, the storage node N1 is supplied with a voltage of a level of (Vcc−Vth). Here, Vth is a threshold voltage of the transistor TR3 including the substrate bias effect. Along with the reduction of the power supply voltage Vcc, the voltage loss due to the threshold voltage Vth of the access transistors TR3, TR4 becomes relatively larger. Therefore, when the power supply voltage Vcc becomes lower, the level of the voltage set in the storage node N1 also becomes lower, and the data holding characteristic of the memory cell becomes unstable.

Further, in a read operation, since a large operating voltage cannot be taken out from the bit line BL or the bit sub line/BL, the operating stability of the sense amplifier or other amplification circuit connected to the bit line BL and the bit sub line /BL deteriorates, erroneous operations readily occur, and there is a possibility of error occurring in the read data.

SUMMARY OF THE INVENTION

The present invention was made in consideration with such a circumstance and has as an object thereof to provide a word line voltage supply circuit capable of avoiding the deterioration of the data holding characteristic of a memory cell at the low power supply voltage and having a stable operating characteristic by generating a driving voltage higher than the power supply voltage using a booster circuit and supplying the same to the memory cell array.

To achieve the above object, according to the present invention, there is provided a word line voltage supply circuit in a semiconductor memory device for generating a voltage different in level from a power supply voltage in response to a change in an input address and supplying the same to a word line, comprising a control circuit generating a pulse signal having a predetermined pulse width after the elapse of a predetermined time from the change of address when detecting a change of input address, a booster circuit performing a boosting operation in response to the pulse signal from the control circuit and generating a boosted voltage different in level from the power supply voltage, and a voltage output transistor having a gate electrode held at a first voltage in response to the change of the input address, then having the boosted voltage supplied to one of the source and drain electrodes, having the gate voltage held at a second voltage higher than the first voltage by exactly the boosted voltage due to capacitive coupling between the gate electrode and said one of the source and drain electrodes, and having the boosted voltage supplied to the other of the source and drain electrodes.

Preferably, a word line is connected to the other electrode of the source and drain electrodes of the voltage output transistor, more preferably, at least one SRAM memory cell is connected to the word line.

Preferably, the word line voltage supply circuit further comprises an address transition detecting circuit for detecting a change in the input address.

More preferably, the control circuit comprises a delay circuit giving a predetermined delay time in response to a timing of completion of the output signal of the address transition detecting circuit.

Still more preferably, the control circuit switches an output signal from a first level to a second level in response to the timing of completion of the output signal of the address transition detecting circuit and switches the output signal from the second level to the first level in response to the output signal of the delay circuit.

Still more preferably, the booster circuit performs the boosting operation and generates a boosted voltage when the output signal of the control circuit is held at the second level.

According to the present invention, for example, an asynchronous SRAM is provided with an address transition detecting circuit for detecting a change of the input address. When a change of the address is detected, an address change signal showing this is output. A pulse signal having a predetermined pulse width is generated by the control circuit in response to the timing of completion of the address change signal and input to the booster circuit as the control signal of the booster circuit. The booster circuit performs a boosting operation during the period when the pulse signal from the control circuit is active and generates a boosted voltage different in level from the power supply voltage, for example, higher than the power supply voltage.

In the voltage output transistor, the control gate is charged to the first voltage level, for example, a level equal to the power supply voltage or near that in response to a change in the address. When the charge is sufficient, since the boosted voltage is supplied to one of the source and drain electrodes, the control gate is held at a level higher than the first voltage by substantially the boosted voltage due to the capacitive coupling between the control gate and the one of the source and drain electrodes. Consequently, a voltage having a level roughly equal to the boosted voltage is output to the other of the source and drain electrodes and the boosted voltage is supplied to the selected word line.

Due to this, when operating at a low power supply voltage, a boosted voltage having a level different from that of the power supply voltage, for example, higher than that of the power supply voltage, is supplied to the selected word line, so the write operation in the selected memory cell can be carried out reliably and the deterioration of the data holding characteristic of the memory cell due to the reduction of the power supply voltage can be avoided.

BRIEF DESCRIPTION OF THE DRAWINGS

These and other objects and features of the present invention will become clearer from the following more detailed description of the related art and the description of the preferred embodiments given with reference to the attached figures, in which:

FIGS. 6A to 6D are waveform diagrams of the operation of the word line driving circuit;

FIGS. 7A to 7D are waveform diagrams of the operation when an address skew occurs;

FIGS. 9A to 9F are waveform diagrams of the operation when an address skew occurs;

DESCRIPTION OF THE PREFERRED EMBODIMENTS

First Embodiment

Figure 1:
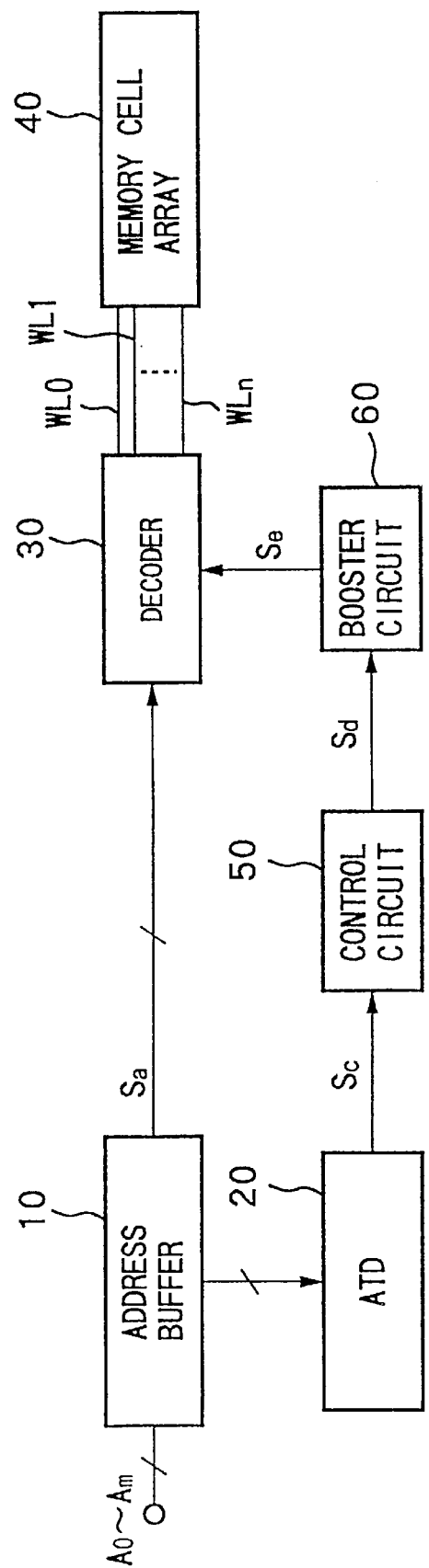
FIG. 1 is a circuit diagram of a first embodiment of a word line voltage supply circuit according to the present invention.

FIG. 1 is a circuit diagram of a first embodiment of a word line voltage supply circuit according to the present invention. As illustrated, the word line voltage supply circuit of the present embodiment is constituted by an address buffer 10, an address transition detecting circuit (ATD) 20, a decoder 30, a memory cell array 40, a control circuit 50, and a booster circuit 60.

The address buffer 10 receives and holds, for example, (m+1) bits of an address signal input from an external portion. The held address signal is output to the ATD 20 and the decoder 30, respectively.

The ATD 20 outputs a detection signal, for example, a pulse signal Sc, when a change in the address signal is detected. The ATD 20 is constituted by, for example, (m+1) number of registers holding (m+1) bits of an address signal and a comparator. Each register holds one bit of a previous address signal. The comparator compares the held previous address signal and the present address signal input from the address buffer 10. When the address signal changes, that is, the previous address signal does not match the present address signal, the pulse signal Sc having a certain pulse width is generated and output to the control circuit 50.

Note that the SRAM according to the present invention is an asynchronous type and differs from a synchronous type where the operations of the system as a whole are controlled by a common system clock signal. The memory operates following to a certain sequence. In order to control the access to the memory such as for a write operation and read operation, it is necessary to detect the change of the address and control the operation according to this. Therefore, an ordinary asynchronous type SRAM is provided with an ATD.

The control circuit 50 operates upon receiving the pulse signal Sc from the ATD 20 and generates a control signal Sd controlling the boosting operation of the booster circuit 60. Specifically, when the pulse signal Sc showing a change of the address signal is input from the ATD 20, the control circuit 50 generates the control signal Sd having a certain width in response to the timing of the pulse signal Sc and controls the boosting operation of the booster circuit 60 by the control signal Sd. Further, when an address skew occurs in the address signal, the control circuit 50 controls the waveform of the control signal Sd to avoid the erroneous operation of the booster circuit 60. Note that the configuration and operation of the control circuit 50 will be described in further detail with reference to a specific circuit diagram later.

The booster circuit 60 is controlled by the control signal Sd from the control circuit 50, and generates a voltage signal Se of a high voltage, for example, a level higher than that of the power supply voltage Vcc, at a certain timing and supplies it to the decoder 30.

The decoder 30 selects one of a plurality of word lines, for example, (n+1) number of word lines WL0, WL1, ..., WLn in accordance with the address signal Sa from the address buffer 10 and supplies the high voltage supplied by the booster circuit 60 to the selected word line.

Figure 12:
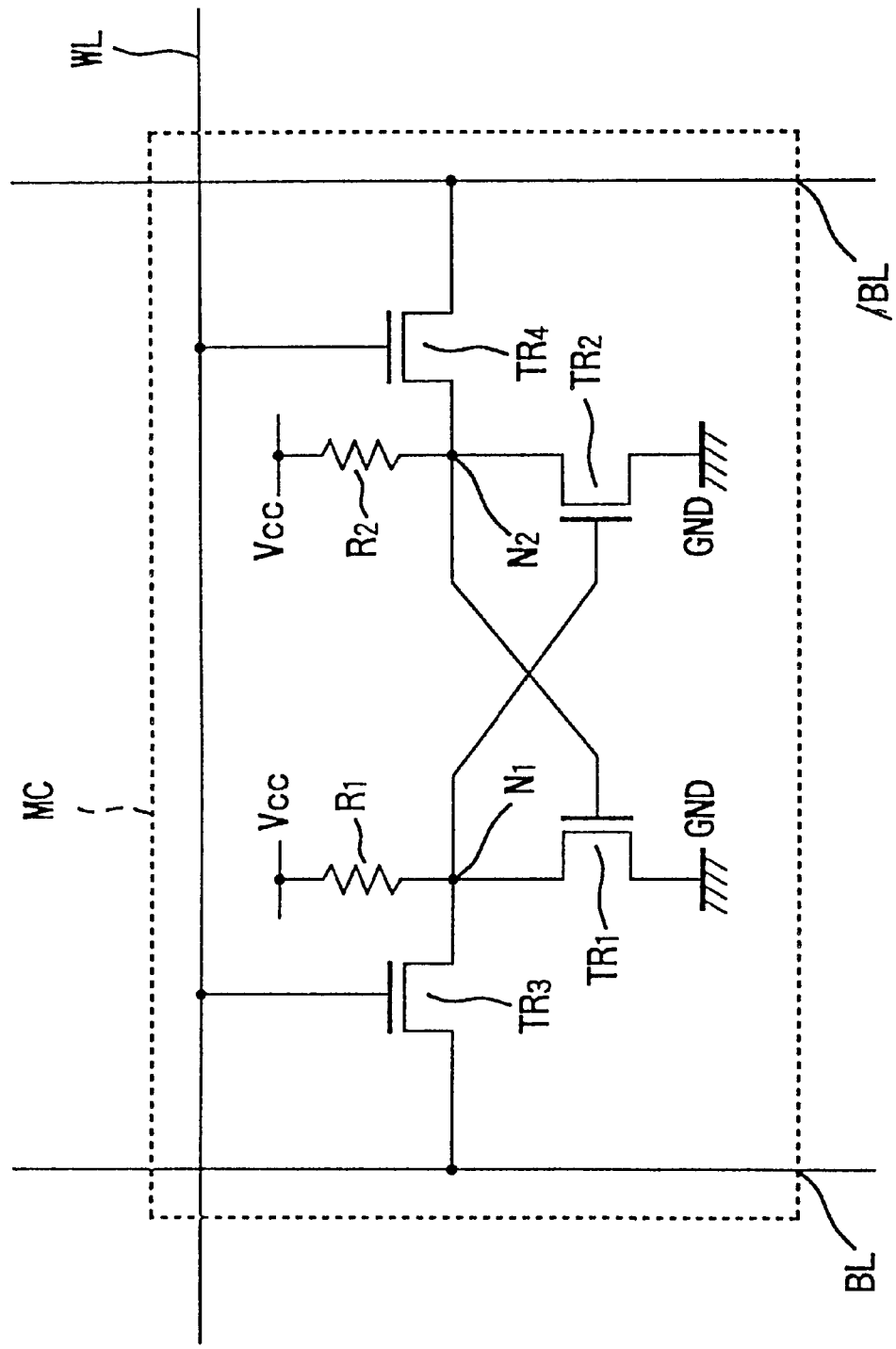
FIG. 12 is a circuit diagram of the configuration of a memory cell of a SRAM according to the related art.

The memory cell array 40 is constituted, for example, by a plurality of memory cells arranged in a matrix. Each memory cell is, for example, a high resistance load type memory cell as shown in FIG. 12. In the memory cell array 40, the memory cells of each line are connected to the same word line, while the memory cells of each column are connected to the same bit line and bit sub line.

In the memory cell array 40 having the configuration described above, the memory cells connected to the word line selected by the decoder 30 are selected. During read or write operations, the data is read from or written into the selected memory cells.

Below, the configurations and operations of the partial circuits of the word line voltage supply circuit of the present embodiment will be explained based on detail examples of the circuits.

Figure 2:
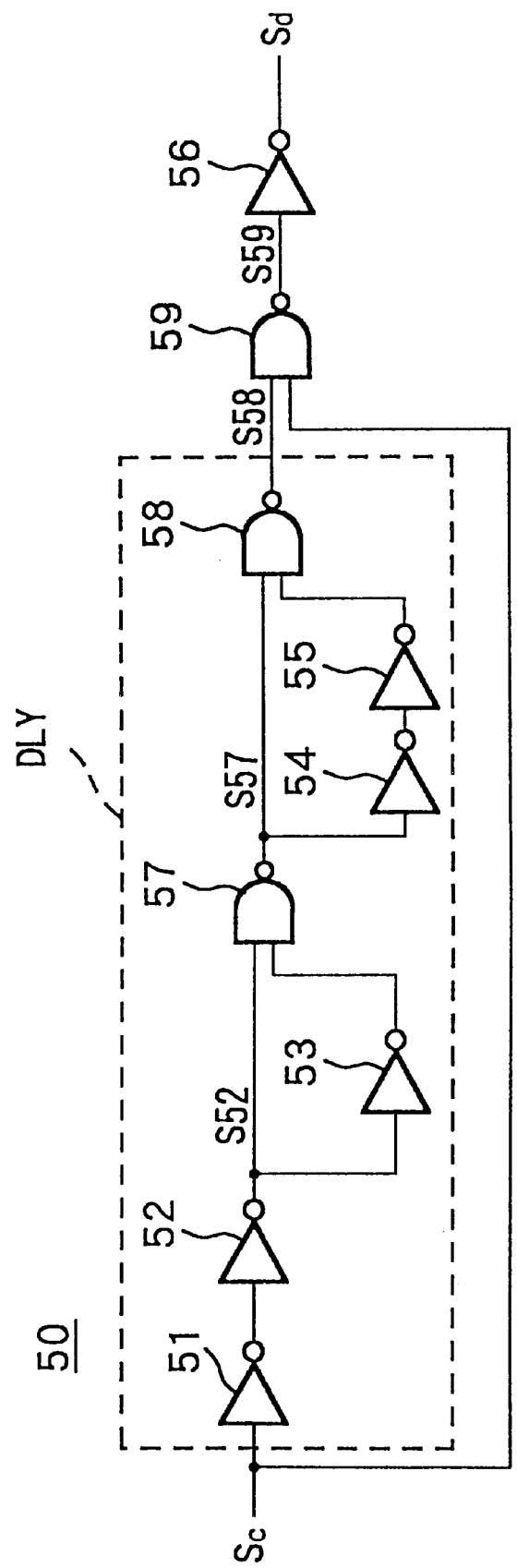
FIG. 2 is a circuit diagram of the configuration of a control circuit.

FIG. 2 shows an example of the configuration of the control circuit 50. As illustrated, the control circuit 50 of this example is constituted by inverters 51 to 56 and NAND gates 57, 58, and 59.

The inverters 51 and 52 are connected in series. The input terminal of the inverter 51 is connected to the output terminal of the ATD 20. A pulse signal Sc showing the change of the address is input from the ATD 20. A pulse signal S52 delayed from the pulse signal Sc is output from the output terminal of the inverter 52.

The input terminal of the inverter 53 is connected to the output terminal of the inverter 52, while the output terminal is connected to one of the input terminals of the NAND gate 57. The other input terminal of the NAND gate 57 is connected to the output terminal of the inverter 52.

The inverters 54 and 55 are connected in series. The input terminal of the inverter 54 is connected to the output terminal of the NAND gate 57, while the output terminal of the inverter 55 is connected to one of the input terminals of the NAND gate 58. The other input terminal of the NAND gate 58 is connected to the output terminal of the NAND gate 57.

One of the input terminals of the NAND gate 59 is connected to the output terminal of the NAND gate 58, while the other input terminal is connected to the input terminal of the inverter 51.

FIGS. 3A to 3F are waveform diagrams of the operation of the control circuit 50. Below, an explanation will be made of the operation of the control circuit 50 while referring to FIG. 2 and FIGS. 3A to 3F.

Figure 3:
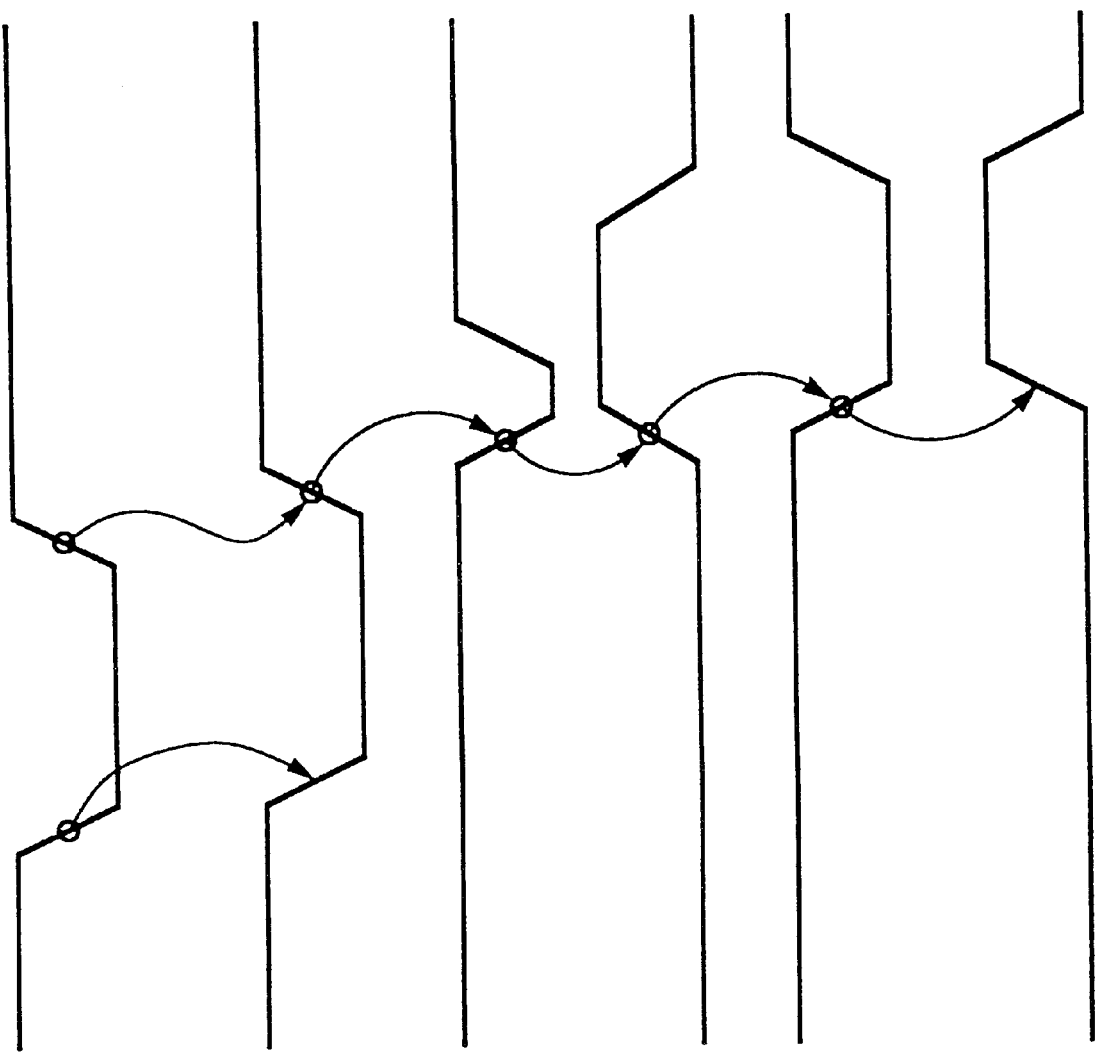
FIGS. 3A to 3F are waveform diagrams of the operation of the control circuit.

As illustrated in FIGS. 3A, the pulse signal Sc from the ADT 20 is a pulse of negative logic having a certain pulse width. As shown in FIG. 2, a delay circuit DLY is constituted by the inverters 51 to 55 and the NAND gates 57 and 58. The pulse signal S58 having a certain pulse width is generated in response to the input pulse signal Sc by the delay circuit DLY and is input to one of the input terminals of the NAND gate 59.

In the delay circuit DLY, the input pulse signal Sc is delayed by the series-connected inverters 51 and 52, and the delay signal S52 is output by the inverter 52. The delay signal S52 is input to the inverter 53 and the NAND gate 57, respectively.

By this, the pulse signal S57 having a pulse width equal to the delay time of the inverter 53 is output by the NAND gate 57 in response to the rising edge of the pulse signal Sc.

The output signal S57 of the NAND gate 57 is further delayed by the series-connected inverters 54 and 55 and input to the NAND gate 58 along with the signal S57. As illustrated in FIG. 3D, a pulse signal S58 having a certain pulse width is output by the NAND gate 58. The pulse signal S58 is input to the NAND gate 59 along with the pulse signal Sc from the ATD 20 as the output signal of the delay circuit DLY.

A pulse signal S59 of negative logic having a pulse width substantially the same as that of the pulse signal S58 is output by the NAND gate 59. The negative pulse signal S59 is further input to the inverter 56. The positive pulse signal Sd having the same pulse width is output by the inverter. The pulse signal Sd is input to the booster circuit 60 for controlling the boosting operation of the booster circuit 60.

Note that since the pulse signal Sc from the ATD 20 is input to the NAND gate 59, the output signal Sd of the control circuit 50 is reset in response to the trailing edge of the pulse Sc. For example, when the output signal Sd of the control circuit 50 is held at the high level, the output signal S59 of the NAND gate 59 is switched from the low level to the high level when the input signal Sc is switched to the low level. Consequently, the output signal of the inverter 56, that is, the output signal Sd of the control circuit 50 is switched from the high level to the low level and reset.

Figure 4:
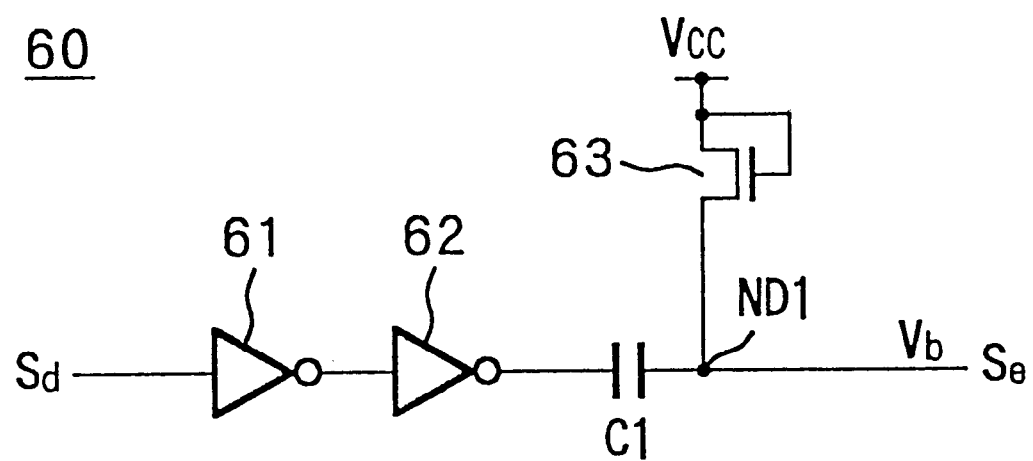
FIG. 4 is a circuit diagram of the configuration of a booster circuit.

FIG. 4 is a circuit diagram of an example of the configuration of the booster circuit 60. As illustrated, the booster circuit 60 is constituted by inverters 61 and 62, a capacitor C1, and an nMOS transistor 63.

The inverters 61 and 62 and the capacitor C1 are connected in series between the input terminal of the booster circuit 60 and a node ND1. The source and gate of the transistor 63 are both connected to the power supply voltage Vcc, while the drain is connected to the node ND1. The node ND1 is connected to the output terminal of the booster circuit 60.

The pulse signal Sd from the control circuit 50 is input to the input terminal of the booster circuit 60. The output terminal of the inverter 62 is held at the low level, for example, the level of the ground GND, when there is no input pulse. Since the node ND1 is held at a voltage lower than the power supply voltage Vcc by the threshold voltage Vth of the transistor by the diode-connected nMOS transistor 63, the capacitor C1 is charged to the level of (Vcc−Vth).

The output terminal of the inverter 62 is held at the high level, for example, the level of the power supply voltage Vcc, when the pulse signal Sd is input from the input terminal of the booster circuit 60. The node ND1 is raised to nearly (2Vcc−Vth) by the capacitive coupling of the capacitor C1. Below, the voltage (2Vcc−Vth) generated by the booster circuit 60 will be referred to as a boosted voltage Vb. That is, when the pulse signal Sd is input to the booster circuit 60, a signal Se having a level of the boosted voltage Vb is output. In other cases, the signal Se is, for example, held at a level lower than the power supply voltage Vcc by the threshold voltage Vth of the transistor 63 (Vcc−Vth).

The boosted voltage Vb is supplied to the decoder 30. The decoder 30 selects one word line from (n+1) number of word lines WL0, WL1, ..., WLn in accordance with the address signal Sa input from the address buffer 10 and supplies the boosted voltage Vb to the selected word line. Consequently, even in the case when operating at a low power supply voltage, the boosted voltage Vb is supplied from the booster circuit 60 to the selected word line, so that the data write and read operations of the memory cells can be carried out reliably and deterioration of the data holding characteristic of the memory cell due to the reduction of the power supply voltage can be avoided.

Figure 5:
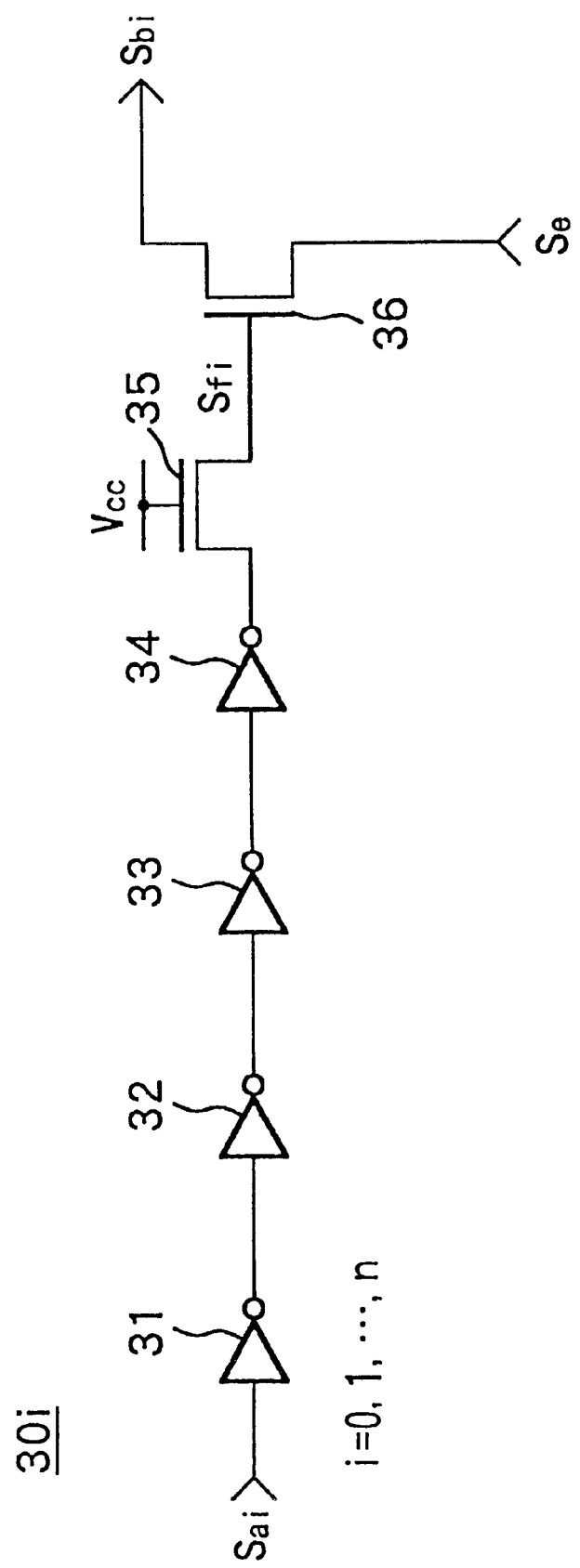
FIG. 5 is a circuit diagram of the configuration of a word line driving circuit provided in a decoder.

FIG. 5 is a circuit diagram of a partial circuit of the decoder 30 showing the configuration of a word line driving circuit 30i. As illustrated, the partial circuit 30i of the decoder is constituted by inverters 31, 32, 33, and 34 and nMOS transistors 35 and 36.

The inverters 31 to 34 are connected in series between an input terminal of a predecoding signal Sai and the drain of the transistor 35. The source of the transistor 35 is connected to the gate of the transistor 36 and the gate is connected to the supply line of the power supply voltage Vcc. The drain of the transistor 36 is connected to the input terminal of the signal Se from the booster circuit 60. An output signal Sbi from the source is, for example, input to one of the word lines WL0, WL1, . . . , WLn.

The decoder 30 shown in FIG. 1 is, for example, constituted by (n+1) number of partial circuits 30i (i=0, 1, . . . , n). The input terminal of each partial circuit 30i, for example, receives as input a predecoding signal Sai generated by a not shown predecoder. Furthermore, the boosted signal Se from the booster circuit 60 is supplied to each partial circuit 30i.

Note that the predecoding signal Sai is set at one of a high level, for example, the level of the power supply voltage Vcc, or a low level, for example, the level of the ground GND, in accordance with the address signal Sa from the address buffer 10.

FIGS. 6A to 6D are waveform diagrams of the operation of the decoder 30. Below, an explanation will be made of the partial circuit 30i of the decoder depicted in FIG. 5 by referring to FIGS. 6A to 6D.

When the predecoding signal Sai is at the low level, the output terminal of the inverter 34 is also held at the low level. Since the gate of the transistor 35 is connected to the supply line of the power supply voltage Vcc, the channel region of the transistor 35 is held at a low level, for example, the level of the ground GND. Namely, the signal Sfi input to the gate of the transistor 36 is held at the low level.

When the predecoding signal Sai is at the high level, the output terminal of the inverter 34 is also held at a high level, for example, the level of the power supply voltage Vcc. At this time, the signal Sfi input to the gate of the transistor 36 is lower than the power supply voltage Vcc by exactly the threshold voltage Vth of the transistor 35, namely, (Vcc−Vth).

When a time Δt elapses from the rising edge of the predecoding signal Sai, the boosted signal Se from the booster circuit 60 rises and switches from the low level to the level of the boosted voltage Vb. The gate of the transistor 36 is held at the level (Vb+Vcc−Vth) by the capacitive coupling between the drain and the gate of the transistor 36. Namely, the level of the signal Sfi is held at (Vb+Vcc−Vth).

As a result, the transistor 36 turns on, and the signal Sbi having the level of the boosted voltage Vb is output from the source. Since the boosted signal Sbi is supplied to the word line WLi, the data write of the memory cell can be carried out reliably and the deterioration of the data holding characteristic can be avoided when operating at a low power supply voltage.

Note that the delay time Δt from the rising edge of the predecoding signal Sai to the rising edge of the boosted signal Se described above is set by the delay time of the delay circuit DLY of the control circuit 50 shown in FIG. 1. In the partial circuit 30i of the present embodiment, the rise of the boosted signal Se following the rise of the predecoding signal Sai is the operating condition for supplying a voltage of the boosted voltage Vb level to the selected word line. If the condition is satisfied, the gate of the transistor 36 is charged to the level of (Vcc−Vth) in advance. When the charge is sufficient, if the boosted voltage Vb is supplied to the drain of the transistor 36, the pulse signal Sbi having the level of the boosted voltage Vb is output from the source.

FIGS. 7A to 7D and FIGS. 9A to 9F are waveform diagrams of the operations of the word line voltage supply circuit of the present embodiment. Below, the operations of the word line voltage supply circuit of the present embodiment will be explained with reference to the waveform diagrams. Further, the principle of the avoidance of erroneous operation due to address skew will be explained based on the operations when an address skew occurs.

As shown in FIGS. 7A to 7D, when the address signal changed, in the predecoding signal consisting of a plurality of bits, for example, the level of the predecoding signal Sai changes from the low level to the high level.

On the other hand, when the level change of the address signal is detected by the ATD 20, an address change signal Sc showing this is output. As illustrated, the pulse signal Sc is a pulse signal of a negative logic having a certain pulse width.

The pulse signal Sc is input to the control circuit 50. By the control circuit 50, a pulse signal Sd having a certain pulse width is generated and supplied to the booster circuit 60. The pulse signal Sd works as a control signal for controlling the boosting timing of the booster circuit 60. Namely, when the control signal Sd is held at the high level, a boosted voltage of the level of the boosted voltage Vb is output from the booster circuit 60. At other times, the output signal Se of the booster circuit 60 is held at a low level, for example, the level of the ground GND.

FIG. 7D shows the timing of generation of the control signal Sd at the trailing edge of the pulse signal Sc from the ATD 20. As illustrated, in this kind of control, when the address changes, the signal Sc is switched to the low level by the ATD 20. In the control circuit 50, since the control signal Sd for controlling the boosting operation is generated in response to the trailing edge of the signal Sc, the control signal Sd is switched from the low level to the high level after a time T2 elapses from the change of the address.

On the other hand, in the decoder 30, the level of the predecoding signal having a plurality of bits is newly set in response to the change of the address. For example, in a predecoding signal having (n+1) bits, the predecoding signal Sai is set from the low level to the high level. As shown in FIG. 5, in the partial circuit 30i operating when receiving the predecoding signal Sai, the gate of the transistor 36 is charged to the level of (Vcc−Vth) in response to the rising edge of the predecoding signal Sai. When the control signal Sd from the control circuit 50 rises, a signal Sbi of the level of the boosted voltage Vb is output from the partial circuit 30i and a pulse of the boosted voltage Vb is supplied to the selected word line.

As illustrated in FIGS. 7A to 7D, the boosted voltage Vb can be supplied to the selected word line normally if the time interval T1 from the rising edge of the predecoding signal Sai to the rising edge of the output signal Sd of the control circuit 50 is held sufficiently.

But in the case when an address skew occurs, namely, the bits of the address signal consisting of a plurality of bits do not change at the same time but change in level sequentially in a certain period of time when updating an address, as Illustrated, if the boosting operation of the booster circuit 60 is controlled by the trailing edge of the output signal Sc of the ATD 20, the rising edge of the predecoding signal Sai comes later in response to the address bit changed in level later, probably later than the rising edge of the control signal Sd.

In this case, in the partial circuit 30i controlled by the predecoding signal Sai, the boosted signal Se rises to the level of the boosted voltage Vb before the gate is sufficiently charged to the level of (Vcc−Vth). As a result, there is a possibility that the voltage supplied to the selected word line can not reach the level of the boosted voltage Vb. In the worst case, when the address skew becomes larger and the boosted voltage Vb is supplied to the drain when the gate of the transistor 36 is not charged, the selected word line cannot be boosted and erroneous operation occurs.

Figures 8A, 8B, 8C:
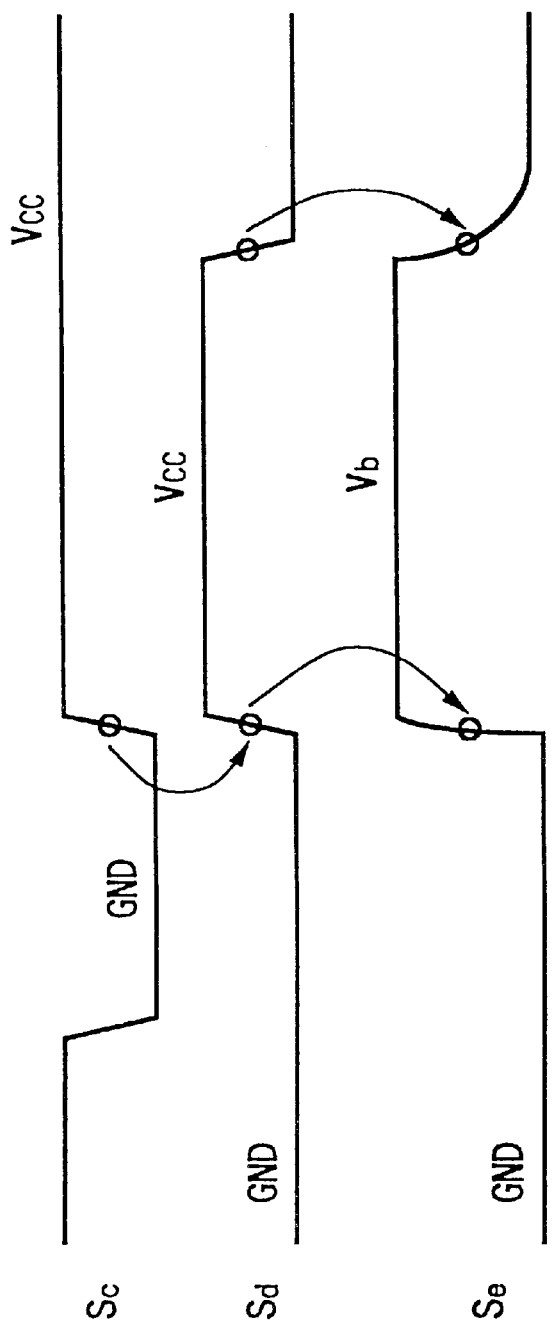
FIGS. 8A to 8C are waveform diagrams of the operation when no address skew occurs.

FIGS. 8A to 8C are waveform diagrams in the case of controlling the timing of the boosting operation by the pulse signal Sc from the ATD 20. As illustrated, in this case, the control signal Sd is switched from the low level to the high level by the control circuit 50 in response to the rising edge of the pulse signal Sc of the negative logic. The booster circuit 60 operates in response to the control signal Sd and the output signal Se is set from the low level to the level of the boosted voltage Vb.

FIGS. 9A to 9F show the operations of the word line voltage supply circuit when an address skew occurs. Below, referring to FIGS. 9A to 9F, an explanation of the output signals of each circuit and an explanation of the characteristic of being able to avoid erroneous operations caused by the address skew when address skew occurs will be made.

As illustrated in FIGS. 9A to 9F, the output signal Sc of the ATD 20 is switched from the high level to the low level in response to the address transition. By the ATD 20, the negative pulse signal Sc having a certain pulse width is output in response to a change of address. The booster circuit 60 works in response to the rising edge of the pulse signal Sc and the output signal Se is switched from the low level to the level of the boosted voltage Vb.

On the other hand, in the decoder 30, the signal Sai out of a plurality of predecoding signals is switched from the low level to the high level by the predecoder in response to a change of the address. Consequently, in the partial circuit 30i of the decoder 30, the boosted voltage Vb is supplied to the transistor 36 after the gate is charged to the level of (Vcc−Vth) sufficiently only if the pulse width of the pulse signal Sc, that is, the output signal of the ATD 20 is sufficiently held. As a result, a voltage of the level of the boosted voltage Vb is supplied to the selected word line, the write operation is carried out reliably, and the deterioration of the data holding characteristic can be avoided.

As illustrated in FIGS. 9A to 9F, when an address skew occurs, for example, the address skew becomes larger and, in the output signal Sc of the ATD 20, as depicted, the pulse signal A2 is generated following the first pulse A1 according to the first change of address. Namely, two pulses are generated separately. In response to the rising edge of the pulse A1, the output signal Sd of the control circuit 50 rises. Accordingly, the booster circuit 60 operates and the signal Se is switched from the low level to the level of the boosted voltage Vb.

The output signal Sd of the control circuit 50 is reset and switched to the low level in response to the trailing edge of the second pulse A2. Accordingly, the output signal Se of the booster circuit 60 is switched to the low level and the boosting operation stops. In response to the rising edge of the second pulse signal Sc, the output signal Sd of the control circuit 50 rises. Accordingly, the booster circuit 60 operates and the output signal Se is set from the low level to the level of the boosted voltage Vb. Consequently, the boosted voltage Vb is supplied after a certain time has elapsed from the final determination of the predecoding signal Sai in response to the last change of address. The boosted voltage Vb is supplied to the selected word line with reliability, erroneous write operation at low power supply voltage can be avoided, and the deterioration of the data holding characteristic of the memory cell can be prevented.

As described above, in the control circuit 50, by resetting the control signal Sd for controlling the boosting operation in response to the trailing edge of the pulse signal Sc, in the case when the address skew occurs and the pulse signal Sc from the ATD 20 is divided, the output signal Sd of the control circuit 50 is reset to the low level, and the operation of the booster circuit 60 is stopped for a while. Consequently, a certain time interval from the last address change until the boosted voltage Vb is supplied to the partial circuit 30i of the decoder 30, and the boosted voltage Vb is input to the transistor 36 after the gate is charged sufficiently. As a result, in spite of the address skew, a voltage at the level of the boosted voltage Vb can be supplied to the selected word line, and the erroneous write operation and the deterioration of the data holding characteristic of the memory cell at low power supply voltage can be avoided.

In the control circuit 50, if there is no function of resetting the output signal Sd in response to the trailing edge of the input pulse signal Sc, the output signal of the booster circuit 60, like the signal Se' shown in FIG. 9F, is held at the level of the boosted voltage Vb in response to the rising edge of the pulse signal Sc. Further, the boosting operation of the booster circuit 60 is carried out continuously. As a result, during the period when the output signal Se' is at the high level, the boosted voltage Vb is not supplied to the selected word line due to the address skew and erroneous operations happen.

By resetting the output signal Sd of the control circuit 50 in response to the trailing edge of the pulse signal Sc, the operation of the booster circuit 60 is forced to stop and the output signal Se of the booster circuit 60 is held at the low level temporarily, whereby the charge time is sufficiently held and the boosted voltage Vb is supplied to the selected word line with reliability. Therefore, avoidance of the erroneous operation and improvement of the data holding characteristic can be achieved.

As explained above, according to the present embodiment, the address transition detecting circuit (ATD) 20 detects a change of the address and generates the pulse signal Sc. The control circuit 50 generates a pulse signal Sd having a certain pulse width in response to the timing of completion of the signal Sc and outputs this to the booster circuit 60. The booster circuit 60 generates the boosted voltage higher than the power supply voltage during the active period of the signal Sd and outputs this to the decoder 30. The decoder 30 selects the word line designated by the address out of a plurality of word lines, holds the control gate of the output transistor connected to the selected word line at the power supply voltage or a first voltage level near that, then inputs the boosted voltage to one of the source and drain so as to hold the control gate at a second voltage level higher than the first voltage level by exactly the boosted voltage by the capacitive coupling between the gate and the source or drain.

Consequently, it outputs the boosted voltage to the other of the drain or source and supplies the boosted voltage to the selected word line, so when operating at a low power supply voltage, a boosted voltage higher than the power supply voltage is supplied to the selected word line, the write operation can be carried out reliably, and the deterioration of the data holding characteristic of the memory cell due to the reduction of the power supply voltage can be prevented.

Second Embodiment

Figure 10:
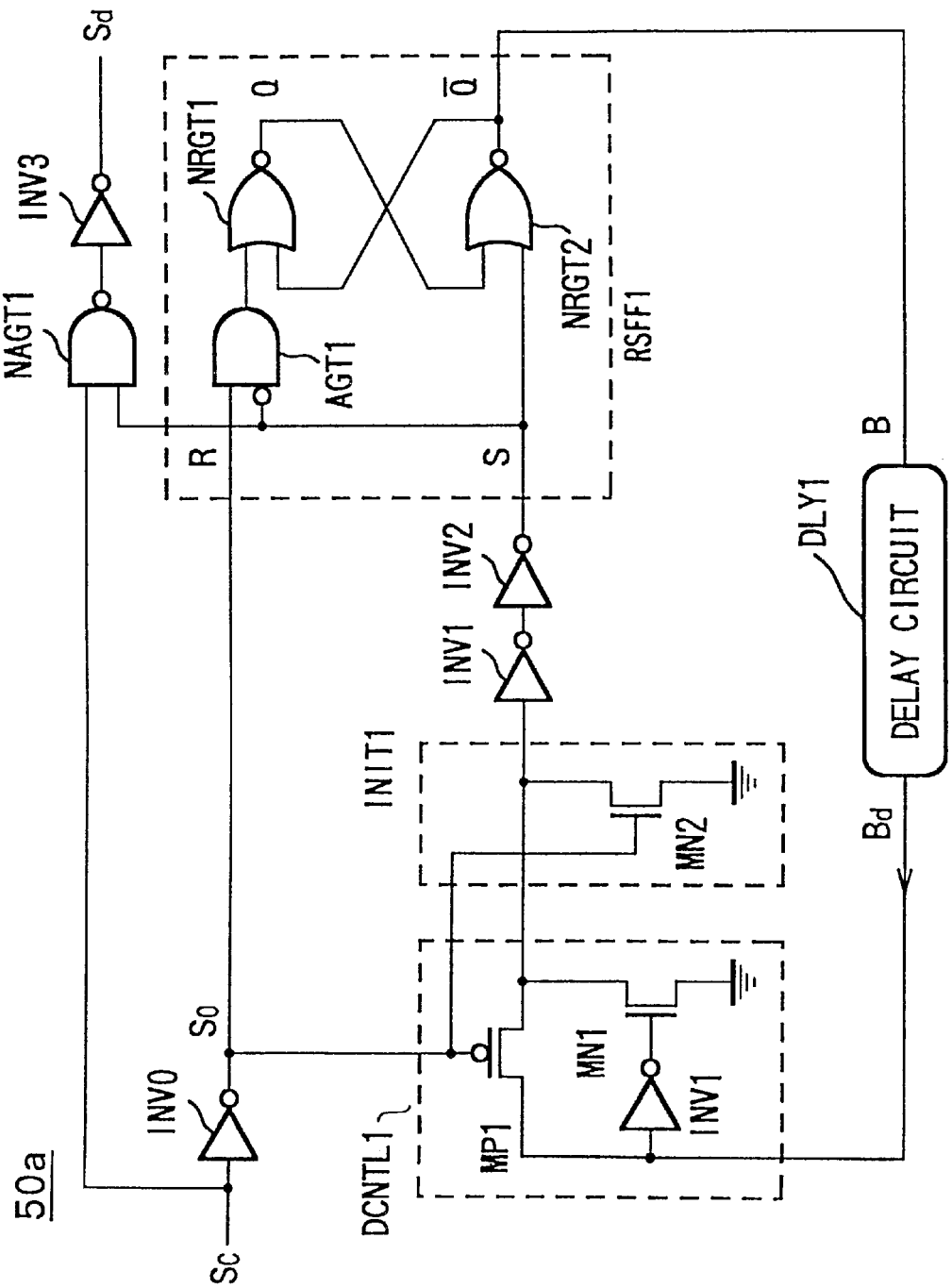
FIG. 10 is a circuit diagram of a control circuit in a word line voltage supply circuit according to a second embodiment of the present invention.

FIG. 10 is a circuit diagram of a word line voltage supply circuit according to a second embodiment of the present invention and shows a modification of the control circuit 50a.

As illustrated, the control circuit 50a of this embodiment is constituted by a delay circuit DLY1, a set-priority set/reset flip-flop (hereinafter simply referred to as a flip-flop) RSFF1, a signal transfer control circuit DCNTL1, and an initialization circuit INIT1 for initializing the output signal Sd.

The transfer control circuit DCNTL1 is constituted by a p-channel MOS transistor (hereinafter simply referred to as a PMOS transistor) MP1 controlled by the output signal of an inverter INV0 and an nMOS transistor MN1 for allowing the data signal of the low level to pass there through by controlling the gate by the inverted signal of the data signal when the data signal is at the low level.

The input signal Sc is input to the inverter INV0 and the gate of a NAND gate NAGT1. The output signal So of the inverter INV0 is input to the reset input terminal R of the flip-flop RSFF1 as well as to the gates of the pMOS transistor MP1 constituting the signal transfer control circuit DCNTL1 and a nMOS transistor MN2 constituting the initialization circuit INIT1. A delayed signal Bd obtained by delaying an inverted signal B output from the flip-flop RSFF1 by the delay circuit DLY1 is input to the data input terminal of the transfer control circuit DCNTL1. The output terminal of the transfer control circuit DCNTL1 is connected to the set input terminal S of the flip-flop RSFF1 via two stages of inverters INV1 and INV2 connected in series.

The initialization INIT1 is constituted by an nMOS transistor MN2. The gate of the nMOS transistor MN2 is connected to the output terminal of the inverter INV0, the drain is connected to the output terminal of the transfer control circuit DCNTL1, and the source is grounded.

FIGS. 11A to 11F are waveform diagrams of the operation of the control circuit 50a of FIG. 10. Below, an explanation will be made of the control circuit 50a of the present embodiment by referring to FIG. 10 and FIGS. 11A to 11F.

Figures 11A, 11B, 11C, 11D, 11E, 11F:
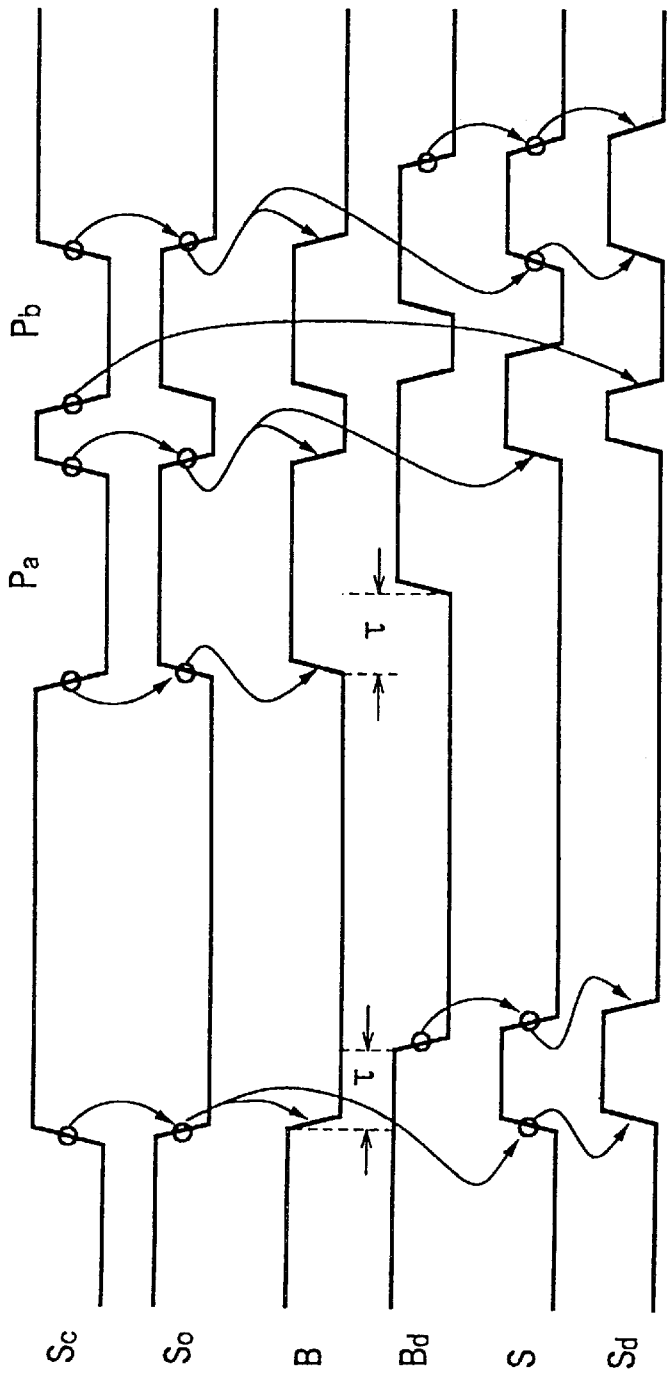
FIGS. 11A to 11F are waveform diagrams of the operation of the control circuit of FIG. 10

As illustrated in FIG. 11A and 11B, the inverted signal So of the input signal Sc is output by the inverter INV0. Consequently, when the input signal is held at the low level, the output signal So of the inverter is held at the high level and the nMOS transistor MN2 in the initialization circuit INIT1 is set at an on state. Accordingly, the set input terminal S of the flip-flop RSFF1 is held at the low level. Further, at this time, since the reset input terminal R of the flip-flop RSFF1 is held at the high level, the flip-flop RSFF1 is reset and the input signal B of the delay circuit DLY1 is held at the high level. Further, the output signal Bd of the delay circuit DLY1 is also held at the high level.

In response to the rising edge of the input signal Sc, the output signal So of the inverter falls, and the pMOS transistor MP1 of the transfer control circuit DCNTL1 is switched from the on state to the off state accordingly. At this time, since the output signal Bd of the delay circuit DLY1 is held at the high level, the output terminal of the inverter INV2 is switched to the high level. Namely, the set input terminal S of the flip-flop RSFF1 is switched from the low level to the high level. Further, the output signal So, that is, the signal at the low level is input to the reset input terminal R of the filp-flop RSFF1, the flip-flop RSFF1 is set, and an input signal B of the delay circuit DLY1 is switched to the low level.

The output signal Bd of the delay circuit DLY1 is switched to the low level after the delay time τ of the delay circuit DLY1. Accordingly, the output terminal of the inverter INV1 is set at the high level and the nMOS transistor MN1 turns on. According to this, the input terminal of the inverter INV1 is set to the low level, and the output terminal of the inverter INV2 is also set to the low level.

Namely, the output signal of the inverter INV2 is held at the high level during the interval of the delay time τ of the delay circuit DLY1 from the rising edge of the input signal Sc. The output signal of the inverter INV2 is input to the NAND gate NAGT1 along with the input signal Sc, further the output signal of the NAND gate NAGT1 is input to the inverter INV3 and the output signal of the inverter INV3 is output to the external portion as the output signal Sd of the control circuit 50a.

The state of the flip-flop RSFF1 is held until the level of the input signal Sc changes. The output signal So of the inverter INV0 rises in response to the trailing edge of the input signal Sc. Accordingly since the reset input terminal R of the flip-flop RSFF1 is held at the high level while the set input terminal S is held at the low level, the flip-flop RFSS1 is reset. Namely, the input signal B of the delay circuit DLY1 is switched to the high level, further after the delay time τ of the delay circuit DLY1, the output signal Bd of the delay circuit DLY1 is switched to the high level, too.

Subsequently, as shown in FIGS. 11A to 11F, for example, in the case when the input signal Sc of the control circuit 50a is separated due to an address skew, namely, as illustrated, the signal Sc is divided into two pulses Pa and Pb, and the output signal Sd of the control circuit 50a is set to the high level in response to the rising edge of the pulse Pa first. Subsequently, the signal Sd is reset and switched from the high level to the low level in response to the trailing edge of the pulse Pb. The output signal Sd is switched to the high level again in response to the rising edge of the pulse Pb, and a pulse signal of positive logic having a width set by the delay time of the delay circuit DLY1 is generated and output.

In response to the control circuit 50a of the present invention, the output signal of the inverter INV2 is input to the NAND gate NAGT1 along with the input signal Sc. By resetting the output signal Sd in response to the input signal Sc, in the case when an address skew occurs, since the output signal Sd of the control circuit 50a is reset, the boosted voltage Vb can be supplied to the decoder 30 at an appropriate timing, therefore the charge time of the gate of the output use transistor of the word line driving circuit (partial circuit) 30i in the decoder 30 can be secured sufficiently and the supply of the boosted voltage Vb to the selected word line can be achieved reliably. The occurrence of the erroneous operation in the writing and reading can be prevented and the deterioration of the data holding characteristic of the memory cell can be avoided.

Summarizing the effects of the invention, as explained above, according to the word line voltage supply circuit of the present invention, by generating the boosted voltage different from the power supply voltage and supplying the boosted voltage to the selected word line during the memory access, there is an advantage that the word line driving voltage can be set at a high level with which the access of the memory cell can be carried out sufficiently when operating at the low power supply voltage, the writing and reading can be performed reliably, and the deterioration of the data holding characteristic of the memory cell can be avoided.

While the invention has been described with reference to specific embodiments chosen for purposes of illustration, it should be apparent that numerous modifications could be made thereto by those skilled in the art without departing from the basic concept and scope of the invention.

What is claimed is:

1. A word line voltage supply circuit in a semiconductor memory device for generating a voltage different in level from a power supply voltage in response to a change in an input address and supplying the same to a word line, comprising:

a control circuit generating a pulse signal having a predetermined pulse width after the elapse of a predetermined time from the change of address when detecting a change of the input address, a booster circuit performing a boosting operation in response to the pulse signal from the control circuit and generating a boosted voltage different in level from the power supply voltage, and a driver circuit comprising first and second transistors, said first transistor having a first gate electrode connected to a second source electrode of said second transistor, said first transistor further having one of a first source and a first drain electrodes connected to receive the boosted voltage from said booster circuit, said first gate electrode being held at a first voltage in response to the change of the input address received on a second drain electrode of said second transistor, and at a second voltage higher than the first voltage by exactly the boosted voltage due to capacitive coupling between said first gate electrode and said one of the first source and first drain electrodes in response to the boosted voltage being received on one of said first source and drain electrodes, and the other of said first source and first drain electrodes outputting the boosted voltage to the word line.

2. A word line voltage supply circuit as set forth in claim 1, wherein a word line is connected to the other of said first source and first drain electrodes.

3. A word line voltage supply circuit as set forth in claim 2, wherein at least one SRAM memory cell is connected to the word line.

4. A word line voltage supply circuit as set forth in claim 1, further comprising an address transition detecting circuit for detecting a change in the input address and generating an address detecting circuit output signal.

5. A word line voltage supply circuit as set forth in claim 4, wherein the control circuit comprises a delay circuit providing a delay circuit output signal having a predetermined delay time in response to a timing of completion of the address transition detecting circuit output signal.

6. A word line voltage supply circuit as set forth in claim 5, wherein the control circuit switches control circuit output signal from a first level to a second level in response to the timing of completion of the address transition detecting circuit output signal and switches the control circuit output signal from the second level to the first level in response to the delay circuit output signal.

7. A word line voltage supply circuit as set forth in claim 6, wherein the booster circuit performs the boosting operation and generates a boosted voltage when the output signal of the control circuit is held at the second level.

\* \* \* \* \*